(12) United States Patent
Dinega et al.

(10) Patent No.: US 9,850,402 B2
(45) Date of Patent: Dec. 26, 2017

(54) CMP COMPOSITIONS AND METHODS FOR SELECTIVE REMOVAL OF SILICON NITRIDE

(71) Applicant: Cabot Microelectronics Corporation, Aurora, IL (US)

(72) Inventors: Dmitry Dinega, Aurora, IL (US); Sairam Shekhar, Manassas, VA (US); Renhe Jia, Naperville, IL (US); Daniel Mateja, Oswego, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 534 days.

(21) Appl. No.: 14/100,339

(22) Filed: Dec. 9, 2013

(65) Prior Publication Data

US 2015/0159046 A1  Jun. 11, 2015

(51) Int. Cl.
| | |
|---|---|
| *C09G 1/02* | (2006.01) |
| *H01L 21/306* | (2006.01) |
| *H01L 21/3105* | (2006.01) |
| *C09K 3/14* | (2006.01) |

(52) U.S. Cl.
CPC .............. *C09G 1/02* (2013.01); *C09K 3/1436* (2013.01); *C09K 3/1463* (2013.01); *H01L 21/31053* (2013.01)

(58) Field of Classification Search
None
See application file for complete search history.

(56) References Cited

U.S. PATENT DOCUMENTS

| | | | |
|---|---|---|---|
| 7,504,044 B2 | 3/2009 | Carter et al. | |
| 7,531,105 B2 | 5/2009 | Dysard et al. | |
| 7,846,842 B2 | 12/2010 | Carter et al. | |
| 8,138,091 B2 | 3/2012 | Dysard et al. | |
| 2009/0047870 A1 | 2/2009 | Siddiqui et al. | |
| 2010/0252774 A1* | 10/2010 | Shida et al. ............. 252/79.1 |
| 2012/0264304 A1 | 10/2012 | Ward | |
| 2013/0122705 A1 | 5/2013 | Babu et al. | |
| 2015/0024595 A1* | 1/2015 | Dinega et al. ............. 438/693 |

(Continued)

OTHER PUBLICATIONS

Dandu et al. "Reverse selectivity—high silicon nitride and low silicon dioxide removal rates using ceria abrasive-based dispersions"; J. Colloid & Interface Sci.; 2010; 347: 267-276.

(Continued)

*Primary Examiner* — Allan Olsen
(74) *Attorney, Agent, or Firm* — Thomas Omholt; Erika S. Wilson (57) ABSTRACT

The present invention provides chemical mechanical polishing compositions and methods for polishing a substrate comprising silicon dioxide and silicon nitride, which provide selective removal of SiN relative to silicon oxide (e.g., PETEOS) on patterned wafers. In one embodiment, a CMP method comprises abrading a surface of a substrate comprising SiN and silicon oxide with a CMP composition to remove at least some SiN therefrom. The CMP composition comprises, consists essentially of, or consists of a particulate abrasive (e.g., ceria) suspended in an aqueous carrier and containing a cationic polymer bearing pendant quaternized nitrogen-heteroaromatic moieties, wherein the composition has a pH of greater than about 3.

18 Claims, 5 Drawing Sheets

(56) References Cited

U.S. PATENT DOCUMENTS

2015/0099361 A1* 4/2015 Franz et al. .............. 438/693

OTHER PUBLICATIONS

Dandu et al. "Novel phosphate-functionalized silica-based dispersions for selectively polishing silicon nitride over silicon dioxide and polysilicon films"; J. Colloid & Interface Sci.; 2010; 348: 114-118.

Dandu et al. "Silicon nitride film removal during chemical mechanical polishing using ceria-based dispersions"; J. Electrochem. Soc.; 2011; 158(8): H763-H767.

* cited by examiner

CMP COMPOSITIONS AND METHODS FOR SELECTIVE REMOVAL OF SILICON NITRIDE

FIELD OF THE INVENTION

This invention relates to chemical mechanical polishing (CMP) compositions and methods. More particularly, this invention relates to CMP methods for selective removal of silicon nitride relative to silicon oxide and CMP compositions therefor.

BACKGROUND

In manufacturing of advanced semiconductor devices (both memory and logic) certain integration schemes require a selective removal of silicon nitride (SiN) layer from underlying silicon oxide pattern by chemical mechanical polishing (CMP). Such a process is commonly referred to as "reverse shallow trench isolation" (reverse STI) as opposed to the regular STI process in which silicon oxide is removed from the top of silicon nitride. The typical requirements of a reverse STI CMP slurry are high SiN removal rate and minimal loss of underlying silicon oxide.

Compositions and methods for CMP of the surface of a substrate are well known in the art. Polishing compositions (also known as polishing slurries, CMP slurries, and CMP compositions) for CMP of surfaces of semiconductor substrates (e.g., for integrated circuit manufacture) typically contain an abrasive, various additive compounds, and the like.

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents, acids, bases, or other additives present in the CMP composition) and/or the mechanical activity of an abrasive suspended in the polishing composition. Typical abrasive materials include silicon dioxide, cerium oxide, aluminum oxide, zirconium oxide, and tin oxide.

All methods described previously using cationic abrasives at low pH have reported high selectivity for SiN removal when evaluated by polishing of separate blanket films (blanket wafers) of SiN and silicon oxide. In practice, however, these methods do not achieve the desired level of selectivity when polishing a patterned wafer containing both films, e.g., as in real-world semiconductor manufacture. The potential for obtaining different removal selectivity profiles for blanket wafer polishing versus pattern wafer polishing using the same CMP slurry is well known in the art. Consequently, there is an ongoing need for CMP compositions and methods that achieve true selective SiN removal on a patterned wafer. The invention described herein addresses this need by providing compositions and methods that exhibit selective removal of nitride relative to oxide when polishing a patterned wafer.

SUMMARY

The present invention provides chemical mechanical polishing compositions and methods for polishing a substrate comprising silicon dioxide and silicon nitride, which provide selective removal of SiN relative to silicon oxide (e.g., PETEOS) on patterned wafers. In one embodiment, a CMP method comprises abrading a surface of a substrate comprising SiN and silicon oxide with a CMP composition to remove at least some SiN therefrom. The CMP composition comprises, consists essentially of, or consists of a particulate abrasive (preferably ceria) suspended in an aqueous carrier and containing a cationic polymer bearing pendant quaternized nitrogen-heteroaryl groups. In some embodiments, the cationic polymer comprises a hydrocarbon backbone bearing pendent quaternized nitrogen-heteroaryl groups, such as, e.g., a poly(vinyl-N-alkylpyridinium) polymer or a quaternized poly(vinylimidazole) polymer such as a poly(N1-vinyl-N3-alkylimidazolium) polymer. Examples of suitable quaternizing alkyl groups generally include $C_1$ to $C_6$ alkyl groups (e.g., methyl, ethyl, propyl, butyl, isopropyl, and the like) and arylalkyl groups (e.g., benzyl, 2-phenylethyl, and the like). The cationic polymer is present at a concentration sufficient for at least a portion of the polymer to adsorb on the surface of the abrasive particles and thereby maintain a zeta potential of at least +20 mV on the particles of the particulate abrasive even at the basic pH that develops at the surface of the polishing pad during polishing of silicon nitride. Optionally, one or more other cationic material (e.g., a cationic surfactant) and/or other additives can be included in the composition in addition to the cationic polymer. The composition has a pH of greater than about 3. In some preferred embodiments the CMP composition has a basic pH (i.e., a pH>about 7). In some preferred embodiments the CMP composition has a pH of greater than about 3 or 3.1 (e.g., about 3.2 to about 9.5), or in some cases, a basic pH (preferably about pH 7.1 to about 9.5).

At point of use, the abrasive preferably is present in the CMP composition at a concentration of about 0.1 to about 0.5 (about 0.1 to about 0.4) percent by weight (wt %), and/or the cationic polymer preferably is present in the CMP composition at a concentration of about 20 to about 100 parts-per-million (ppm). Preferably, the particulate abrasive has a mean particle size of about 10 to about 200 nm, e.g., about 60 nm for primary abrasive particles, particularly when ceria is utilized as the abrasive. In a preferred embodiment, the abrading is performed in a CMP polishing apparatus in conjunction with a polishing pad.

In another aspect, the present invention provides a CMP composition (slurry) useful for selectively removing silicon nitride from patterned substrates that include silicon nitride and silicon oxide. The CMP slurry comprises, consists essentially of, or consists of a particulate abrasive (e.g., ceria) suspended in an aqueous carrier containing the cationic polymer as described above. The cationic polymer is present at a concentration sufficient for at least a portion of the polymer to adsorb on the surface of the abrasive particles and maintain a zeta potential of at least +20 mV on the abrasive particles at a basic pH. Preferably, the abrasive (e.g., colloidal ceria) is present in the composition at a concentration of about 0.1 to about 2 wt % (e.g., about 0.4 to about 2 wt %) as supplied or sold. The cationic polymer of the CMP composition preferably is present in the CMP composition at a concentration of about 20 to about 500 ppm (e.g., about 100 to about 500 ppm). Optionally, other cationic materials, such as a cationic surfactant, can be included in the slurry as well, as described above. In some preferred embodiments the CMP composition in this aspect has a pH of greater than about 3 or 3.1 (e.g., about 3.2 to about 9.5), or in some cases, a basic pH (preferably about pH 7.1 to about 9.5).

In use, the composition can be diluted, if necessary, with water or another suitable aqueous carrier so that the concentration of the abrasive preferably is about 0.1 to about 0.5 wt % and the concentration of the cationic polymer is about 20 to about 100 ppm, at point of use.

In one embodiment, a CMP composition useful in the present methods comprises, consists essentially of, or consists of about 0.1 to about 2 wt % of a particulate colloidal ceria abrasive suspended in an aqueous carrier containing about 20 to about 500 ppm of a quaternized poly(vinylpyridine) cationic polymer, a quaternized poly(vinylimidazole) cationic polymer, or a combination thereof. Optionally, the CMP composition has a pH greater than 7, and up to e.g., about 11, about 10, about 9, about 8, or about 7.5. Preferably the CMP composition has a pH of greater than about 3.1 (e.g., about 3.2 to about 9.5, or about 7.1 to about 9.5).

The compositions and methods described herein advantageously and unexpectedly provide unexpectedly high removal selectivity for silicon nitride relative to silicon oxide in CMP of patterned wafers, which is more representative of performance in actual semiconductor chip manufacturing than performance on blanket wafers. The use of quaternized nitrogen-heteroaryl groups (e.g., N-alkylpyridinium and N-alkylimidazolium groups) to provide the cationic charge on the polymer surprisingly appears to be a significant factor in the observed selectivity, since polymers comprising aliphatic quaternary groups, and polymers comprising non-quaternized nitrogen-heteroaryl groups (e.g., pyridyl groups) do not provide the required pattern wafer polishing selectivity for nitride removal relative to oxide removal, although selectivity in blanket wafer evaluations has been observed for such materials.

DETAILED DESCRIPTION OF EXEMPLARY EMBODIMENTS

The CMP compositions useful in the methods described herein include a particulate abrasive component and a cationic polymer component in an aqueous carrier. The cationic polymer helps to maintain a cationic charge on the abrasive particles even at a basic pH during use.

The cationic polymer component includes a plurality of quaternized nitrogen-heteroaryl groups, i.e., heteroaromatic compounds comprising at least one nitrogen in an aromatic ring in which at least one of the nitrogen atoms in the ring is alkylated to impart a formal positive charge on the heteroaryl ring (e.g., on a nitrogen in the ring). Preferably the heteroaryl group is attached to the backbone of the polymer through a carbon-carbon bond (e.g., as in a quaternized poly(vinylpyridine) polymer) or a carbon-nitrogen bond (e.g., as in a quaternized poly(vinylimidazole) polymer) either directly to the aromatic ring or through an alkylene spacer group (e.g., methylene ($CH_2$) or ethylene ($CH_2CH_2$) group). The positive charge on the quaternized nitrogen is balanced by a counter anion, which can be, e.g., a halide (e.g., chloride), nitrate, methylsulfate, or any combination of anions. The cationic polymer preferably is present in the CMP composition at a concentration of about 20 to about 500 ppm. At point of use in a polishing method as described herein, the cationic polymer preferably is present at a concentration of about 20 to about 100 ppm.

In some embodiments, the repeating units of the cationic polymer component of the CMP compositions and methods described herein can be represented by the formula —$CH_2CHR$— in which R is a quaternized nitrogen heteroaryl moiety (e.g., quaternized pyridyl, imidazolyl, oxazolyl, quinolinyl, or pyrazinyl). Typically, the polymer will comprise greater than about 20 or greater than about 50 of such repeating units (e.g., in the range of about 2 up to about 50, 100, 200, 500, 1000, 2000, or 5000). In some embodiments, the cationic polymer comprises, consists essentially of, or consists of a poly(vinyl-N-alkylpyridinium) polymer, such as a poly(2-vinyl-N-alkylpyridinium) polymer, a poly(4-vinyl-N-alkylpyridinium) polymer, a vinyl-N-alkylpyridinium copolymer, a poly(N1-vinyl-N3-alkylimidazolium) polymer, and the like. Optionally, the cationic polymers can comprise some (preferably less than 50%) nonionic monomer units.

The molecular weight of the cationic polymer is not limited, but typically, the cationic polymer has a weight average molecular weight of about 5 kDa or more (e.g., about 10 kDa or more, about 20 kDa or more, about 30 kDa or more, about 40 kDa or more, about 50 kDa or more, or about 60 kDa or more) cationic polymer. The polishing composition preferably comprises a cationic polymer having a molecular weight of about 100 kDa or less (e.g., about 80 kDa or less, about 70 kDa or less, about 60 kDa or less, or about 50 kDa or less). Preferably, the polishing composition comprises a cationic polymer having a molecular weight of about 5 kDa to about 100 kDa (e.g., about 10 kDa to about 80 kDa, about 10 kDa to about 70 kDa, or about 15 kDa to about 70 kDa.

The particulate abrasive can comprise any abrasive material suitable for use in CMP of semiconductor and integrated circuit materials, which can take on a positive charge at basic pH with a cationic polymer adsorbed on the surface of the particles. Examples of such materials include, e.g., silica, ceria, zirconia, and titania. A preferred particulate abrasive is ceria (e.g., colloidal ceria). Preferably, the particulate abrasive has a mean particle size of about 10 to about 200 nm. Preferably, a ceria abrasive comprises primary ceria particles having a mean particle size of about 10 to about 200 nm, more preferably about 40 to 80 nm (e.g., about 60 nm). A ceria abrasive also can include secondary ceria particles having a larger particle size (e.g., about 150 to about 170 nm). Preferably, the abrasive (e.g., colloidal ceria) is present in the CMP composition at a concentration of about 0.1 to about 2 wt % (e.g., about 0.4 to about 2 wt %). At point of use during a polishing method as described herein the abrasive (e.g., colloidal ceria) preferably is present in the CMP composition at a concentration of about 0.1 to about 0.5 wt % (e.g., about 0.1 to about 0.4 wt %).

The CMP compositions of the present invention can have any pH, but preferably have a pH greater 3.1, e.g., in the range of about 3.15 to about 11 (preferably about 3.2 to about 9.5). In some preferred embodiments, the composition has a basic pH, i.e., a pH greater than about 7. In some embodiments the pH may be in the range of about 7.1 up to about 11. In some preferred embodiments the pH is in the range of about 7.1 to about 9.5. The pH of the composition can be achieved and/or maintained by inclusion of a buffering material including a basic component, which can be any inorganic or organic base. In some preferred embodiments, the basic component can be an inorganic base (e.g., sodium or potassium hydroxide) or basic inorganic salt (e.g., a phosphate salt such as sodium or potassium phosphate, hydrogenphosphate or dihydrogenphosphate, or a combination of such phosphates; borate, carbonate), an organic base such as an amine (e.g., a primary, secondary or tertiary amine (e.g., methylamine, 2-amino-2-methyl-1-propanol (AMP), glycine, piperazine, piperidine, ethanolamine, diethanolamine, triethanolamine, an aromatic nitrogen heterocycle, such as a pyridine, and the like). Preferably, a basic pH can be maintained by an organic or inorganic buffer comprising basic and acidic components in amounts and ratios suitable to achieve the desired pH. Basic buffers are well known to those of ordinary skill in the chemical arts.

The polishing compositions of the invention optionally also can include suitable amounts of one or more other additive materials commonly included in polishing compositions, such as metal complexing agents, dispersants, corrosion inhibitors, viscosity modifying agents, biocides, cationic surfactants, nonionic surfactants, inorganic salts, and the like. For example, the composition can include a biocide such as KATHON, KORDEK, or NEOLONE biocides; a complexing agent such as acetic acid, histidine, lysine, glycine, picolinic acid, tartaric acid, iminodiacetic acid, alanine, benzoic acid, nitrilotriacetic acid (NTA), glutamic acid, glutaric acid, beta-alanine, aspartic acid, ornithine, or proline; a corrosion inhibitor such as benzotriazole (BTA), 1,2,3-triazole, 1,2,4-triazole, a tetrazole, 5-aminotetrazole, 3-amino-1,2,4-triazole, phenylphosphonic acid, methylphosphonic acid; and the like. In some embodiments, the CMP composition can include a water soluble salt, e.g., ammonium nitrate for profile control and conductivity. For example, the composition can include about 50 to about 2000 ppm of the water soluble salt. The CMP composition also can include a cationic surfactant that can selectively bind to silicon oxide relative to silicon nitride to further aid in silicon nitride removal selectivity.

The aqueous carrier can be any aqueous solvent, e.g., water, aqueous methanol, aqueous ethanol, a combination thereof, and the like. Preferably, the aqueous carrier comprises predominately deionized water.

The polishing compositions used in the methods described herein can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, polymer, chelating agents, buffers, and the like), as well as any combination of ingredients.

For example, the ceria abrasive can be dispersed in water, combined with the polymer components, and mixed by any method that is capable of incorporating the components into the polishing composition. Typically, an oxidizing agent, when utilized, is not added to the polishing composition until the composition is ready for use in a CMP process, for example, the oxidizing agent can be added just prior to initiation of polishing. The pH can be further adjusted at any suitable time by addition of an acid or base, as needed.

The polishing compositions of the present invention also can be provided as a concentrate, which is intended to be diluted with an appropriate amount of aqueous solvent (e.g., water) prior to use. In such an embodiment, the polishing composition concentrate can include the various components dispersed or dissolved in aqueous solvent in amounts such that, upon dilution of the concentrate with an appropriate amount of aqueous solvent, each component of the polishing composition will be present in the polishing composition in an amount within the appropriate range for use.

The compositions and methods of the invention surprisingly provide selective removal of silicon nitride relative to silicon oxide at the basic pH that develops at the surface of patterned wafers during polishing. Without intending to be bound by theory, we have discovered that in order to achieve significant SiN removal rates with conventional slurries evaluated on patterned wafers, the pH of a polishing slurry, at the surface of the polishing pad, must be basic. If the initial pH of the slurry is acidic, then pH at the surface must shift to >7 for significant polishing to begin. This can happen, e.g., due to a build-up of ammonia near the pad surface as a by-product of nitride removal. Typically, nitride removal rates will remain low (e.g., <100 Å/min) until the pH at the pad surface is in the range of about 8.5 to about 9.5. In contrast, silicon oxide removal is less affected by pH.

If the pH of a conventional slurry, as applied, is acidic, as taught in the prior art for CMP compositions containing certain types of cationic polymers, then polishing of patterned wafers (as well as real-world semiconductor substrates, which patterned wafers simulate) generally does not lead to significant nitride removal selectivity. If the acidic pH is maintained on the polishing pad during the entire polishing time (e.g., by the use of a strong buffer) the nitride removal rate will be low (e.g., less than about 100 Å/min) compared to the oxide removal rate. If, on the other hand, the acidic pH is allowed to slowly drift to basic pH on the pad surface during polishing, this shift toward basic pH may lead to an unnecessarily long nitride polishing initiation period compared to neutral or basic slurries. This may be due, at least in part, to a slower shift toward the required basic pH at the polishing pad surface. The different requirements for surface pH during polishing leads to the typical observation that acidic slurries containing many cationic polymers described in the prior art may afford either no nitride-to-oxide selectivity, or even greater removal rates for oxide relative to nitride when patterned wafers are polished (e.g., as demonstrated by Comparative Examples 5 and 6 below). In the compositions and methods described herein, the pH of the slurry surprisingly can be in the acidic to basic range, as applied, and still achieve high selectivity in patterned wafer polishing, due to the unique ability of the quaternized heterocyclic cationic polymers to promote nitride polishing.

The CMP methods of the invention preferably are achieved using a chemical-mechanical polishing apparatus. Typically, the CMP apparatus comprises a platen, which, when in use, is in motion and has a velocity that results from orbital, linear, and/or circular motion, a polishing pad in contact with the platen and moving relative to the platen when in motion, and a carrier that holds a substrate to be polished by contacting and moving relative to the surface of the polishing pad. The polishing of the substrate takes place by the substrate being placed in contact with the polishing pad and a polishing composition of the invention and then moving the polishing pad relative to the substrate, so as to abrade at least a portion of the substrate to polish the substrate.

The following examples further illustrate certain aspects of the invention but, of course, should not be construed as in any way limiting its scope. As used herein and in the following examples and claims, concentrations reported as parts-per-million (ppm) or percent by weight (wt %) are based on the weight of the active component of interest divided by the weight of the composition. Unless otherwise noted, silicon oxide and nitride patterned wafers used for evaluation of CMP compositions used herein comprise a number of pattern features, including, for example, line features with pitch values between 0.36 μm and 1800 μm (pitch being the combined width of lines and spacing recesses) at a line density of 50%, line features with a pitch of 50 μm at densities of 10% to 90%, as well as memory-type structures (D-cell structures) that have a size of 0.36 μm×1.0 μm at a pattern density of about 37% to 38%.

Example 1

This example illustrates the effect of nitride removal on pH at the pad surface for slurries having different starting slurry pH values and comprising 0.4 wt % colloidal ceria (about 60 nm average primary particle size) and about 47 ppm of poly(2-vinyl-N-methylpyridinium chloride) in water. Silicon nitride blanket wafers were polished using an DOW IC1010 pad on an Applied Materials MIRRA polisher at a platen speed of about 100 rpm, a carrier speed of about 85 rpm, a down force of about 2 psi, and a slurry flow rate of about 150 mL/minute; polishing time: 60 seconds. The initial slurry pH values, observed removal rates (RR), and pH at the pad surface, are recorded in Table 1. As is apparent form the data in Table 1, acidic slurries having initial pH values of about 3.2 to 4.5 provided removal rates of greater than 800 Å/min, and ultimately provided a pH in the range of about 8.8 to 9.3 at the pad surface. The slurry with initial pH of 3.05 provided only a 43 Å/min nitride removal rate, and the pH at the pad surface remained acidic.

TABLE 1

| Slurry | Slurry pH | Nitride RR | Pad Surface pH |
|---|---|---|---|
| 1 | 4.5 | 830 Å/min | 9.3 |
| 2 | 4.0 | 845 Å/min | 9.2 |
| 3 | 3.5 | 860 Å/min | 9.1 |
| 4 | 3.2 | 865 Å/min | 8.8 |
| 5 | 3.05 | 43 Å/min | 3.1 |

Example 2

This example illustrates the selectivity of a basic CMP slurry comprising a cationic polymer bearing pendant quaternized nitrogen-heteroaryl groups as described herein for removal of nitride relative to oxide on a patterned wafer.

Figure 1:
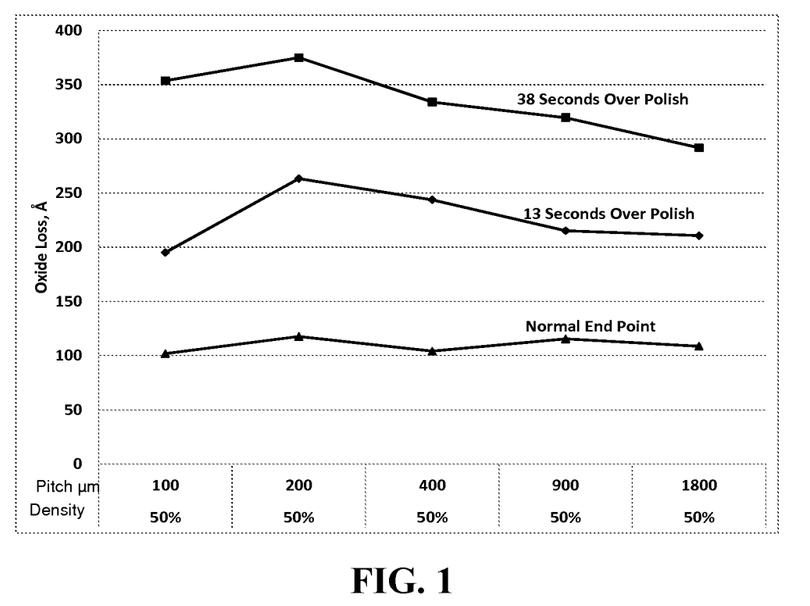
FIG. 1 provides a graph of patterned silicon oxide removal at various over-polishing times observed upon polishing a patterned wafer with a CMP composition comprising a quaternized poly(vinylpyridine) polymer as described in Example 2; the layer thickness values (in Å) shown were determined for lines features with pitches of 100, 200, 400, 900 and 1800 μm at a line density of 50%.

An aqueous polishing slurry having a pH of about 9.0 and comprising colloidal ceria (0.4 wt %, primary mean particle size of about 60 nm) and about 50 ppm of poly(2-vinyl-N-methylpyridinium chloride) in water was used to polish nitride and oxide blanket wafers and a patterned wafer comprising patterned silicon nitride and silicon oxide. Polishing was accomplished using a DOW IC1010 pad on a MIRRA polisher at a platen speed of 100 rpm, a carrier speed of about 85 rpm, a down force of about 2 psi, and a slurry flow rate of about 150 mL/minute. Table 2 provides the observed nitride and oxide removal rates and the selectivity (nitride RR/oxide RR), while FIG. 1 provides a graph of oxide removal (loss) at over-polishing (OP) times of 0 seconds over-polish (normal endpoint, EP, about 86 seconds), 13 seconds OP, and 38 seconds OP.

TABLE 2

| Slurry | SiN RR | Oxide RR | N/O Selectivity |
|---|---|---|---|
| Blanket | 785 Å/min | 187 Å/min | 4.2 |
| Pattern | 685 Å/min | 310 Å/min | 2.2 |

The data in Table 2 clearly indicate that selectivity for nitride removal relative to oxide was maintained when switching from blanket wafers to patterned wafers. The results in FIG. 1 show that oxide removal was fairly constant for each of the line features examined (100, 200, 400, 900 and 1800 micron lines) at each over-polish time point, with a slightly higher removal for the 200 and 400 micron lines.

Example 3

This example further illustrates the selectivity of an acidic CMP slurry comprising a cationic polymer bearing pendant quaternized nitrogen-heteroaryl groups for removal of nitride relative to oxide on a patterned wafer.

Figure 2:
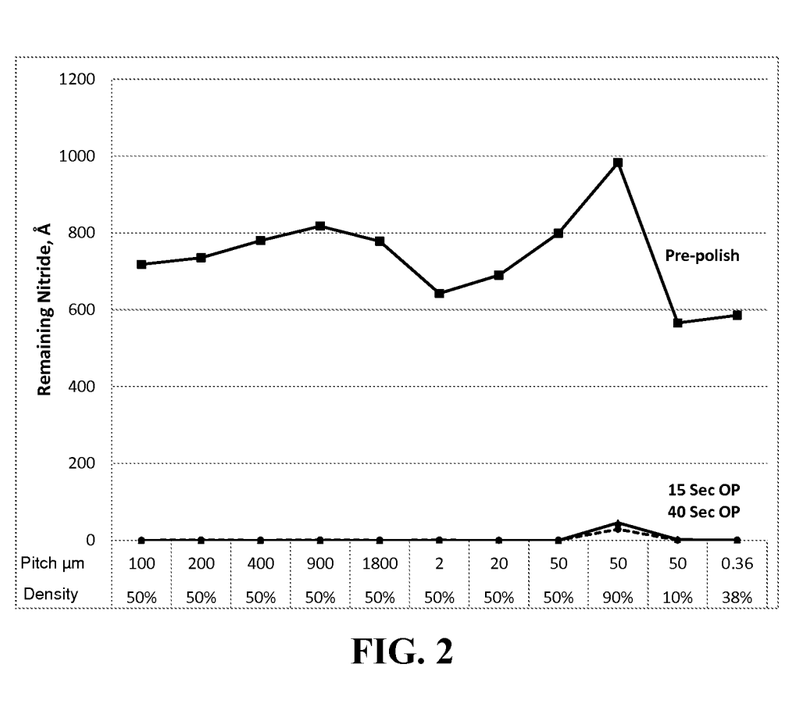
FIG. 2 provides a graph of remaining patterned silicon nitride at OP times of 15 and 40 seconds compared to the pre-polish nitride thickness observed upon polishing a patterned wafer with a CMP composition comprising a quaternized poly(vinylpyridine) polymer at pH 3.2 as described in Example 3; the layer thickness values (in Å) shown were determined for lines features with pitches of 2, 20, 100, 200, 400, 900 and 1800 μm at a line density of 50%, line features with pitches of 50 μm at line densities of 90%, 50%, and 10%, and a D-cell feature at a density of about 38%.
Figure 3:
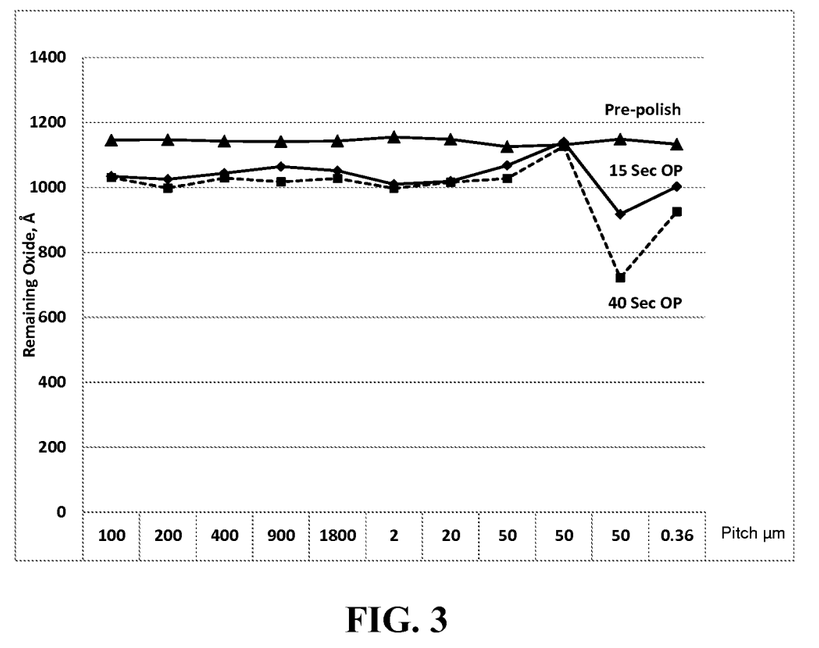
FIG. 3 provides a graph of remaining patterned silicon oxide at OP times of 15 and 40 seconds compared to the pre-polish oxide thickness observed upon polishing a patterned wafer with a CMP composition comprising a quaternized poly(vinylpyridine) polymer at pH 3.2 as described in Example 3; the layer thickness values (in Å) shown were determined for lines features with pitches of 2, 20, 100, 200, 400, 900 and 1800 μm at a line density of 50%, line features with pitches of 50 μm at line densities of 90%, 50%, and 10%, and a D-cell feature at a density of about 38%.

An aqueous polishing slurry having a pH of about 3.2 and comprising colloidal ceria (0.4 wt %, primary mean particle size of about 60 nm) and about 50 ppm of poly(2-vinyl-N-methylpyridinium chloride) in water was used to polish nitride and oxide blanket wafers and a patterned wafer comprising patterned silicon nitride and silicon oxide. Polishing was accomplished using a DOW IC1010 pad on a MIRRA polisher at a platen speed of 100 rpm, a carrier speed of about 85 rpm, a down force of about 2 psi, and a slurry flow rate of about 150 mL/minute. Table 3 provides the observed nitride and oxide removal rates and the selectivity (nitride RR/oxide RR), while FIG. 2 provides a graph of remaining silicon nitride at OP times of 15 seconds and 40 seconds compared to the starting oxide thickness (labeled "PRE"). FIG. 3 provides the corresponding graph of remaining oxide.

TABLE 3

| Slurry | SiN RR | Oxide RR | N/O Selectivity |
|---|---|---|---|
| Blanket | 867 Å/min | 114 Å/min | 7.6 |
| Pattern | 642 Å/min | 102 Å/min | 6.3 |

The data in Table 3 clearly indicate that selectivity for nitride removal relative to oxide was very good for both blanket and patterned wafers. The results in FIG. 2 demonstrate that nitride was readily removed from the patterned wafer under the test conditions. In contrast, the results in FIG. 3 show that little oxide was removed from the same wafer over the same polishing run, indicating a high selectivity for nitride removal over oxide removal.

Example 4

This example illustrates the selectivity of a CMP slurry comprising a cationic polymer bearing pendant quaternized imidazole groups for removal of nitride relative to oxide on a patterned wafer.

Figure 4:
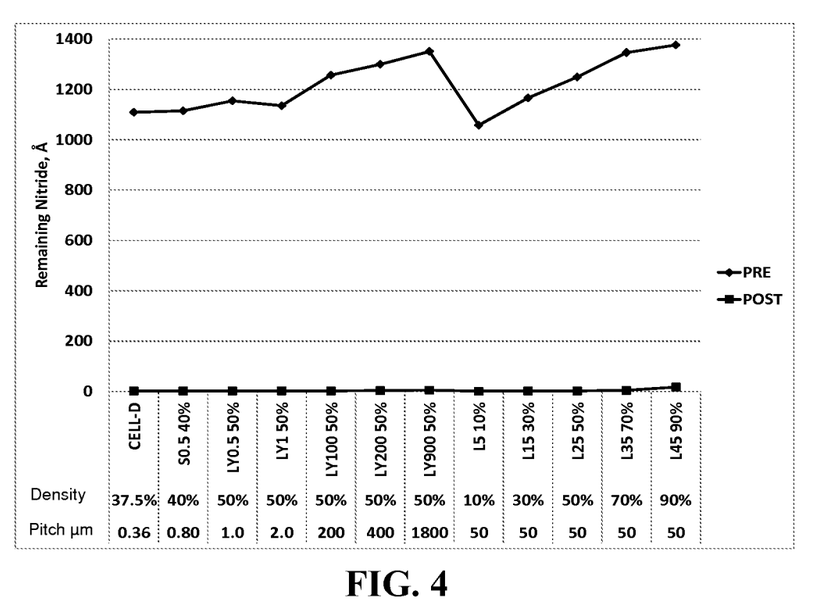
FIG. 4 provides a graph of remaining patterned silicon nitride observed upon polishing a patterned wafer with a CMP composition comprising a quaternized poly(vinylimidazole) polymer as described in Example 4, at an OP time of 10 seconds compared to the pre-polishing nitride thickness; the normal polishing end point was 55 seconds; the layer thickness values (in Å) shown were determined for lines features with pitches of 0.8, 1, 2, 200, 400, and 1800 μm at a line density of 50%, line features with pitches of 50 μm at line densities of 10%, 30%, 50%, 70% and 90%, and a D-cell feature at a density of about 37.5%.
Figure 5:
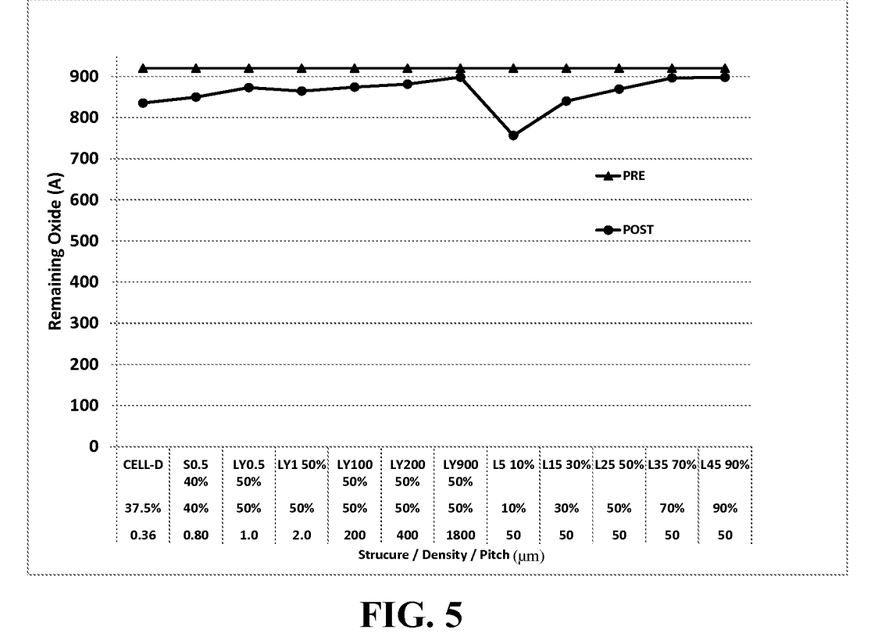
FIG. 5 provides a graph of remaining patterned silicon oxide removal observed upon polishing a patterned wafer with a CMP composition comprising a quaternized poly (vinylimidazole) polymer as described in Example 4, at an OP time of 10 seconds compared to the pre-polishing oxide thickness; the normal polishing end point was 55 seconds; the layer thickness values (in Å) shown were determined for lines features with pitches of 0.8, 1, 2, 200, 400, and 1800 μm at a line density of 50%, line features with pitches of 50 μm at line densities of 10%, 30%, 50%, 70% and 90%, and a D-cell feature at a density of about 37.5%.

An aqueous polishing slurry having a pH of about 7.1 and comprising colloidal ceria (0.4 wt %, primary mean particle size of about 60 nm) and about 50 ppm of quaternized poly(vinylimidazole), and about 650 ppm of triethylamine (TEA) in water was used to polish nitride and oxide blanket wafers and a patterned wafer comprising patterned silicon nitride and silicon oxide. Polishing was accomplished using a DOW IC1010 pad on an Applied Materials REFLEXION polisher at a platen speed of 100 rpm, a carrier speed of about 85 rpm, a down force of about 2 psi, and a slurry flow rate of about 250 mL/minute. A nitride/oxide selectivity of about 64 (1465 Å/min nitride removal rate and 23 Å/min oxide removal rate) was observed for blanket wafers. FIG. 4 and FIG. 5 provide graphs of remaining nitride and remaining oxide, respectively, at an over-polish time of 10 seconds (normal end point of 55 seconds), with the initial nitride and oxide thicknesses indicated by the label "PRE" for comparison. The estimated selectivity for nitride removal relative to oxide removal on the patterned wafer was about 5.

Example 5 (Comparative)

This example illustrates the lack of pattern wafer nitride/oxide polishing selectivity utilizing a CMP slurry comprising a non-quaternized poly(4-vinylpyridine) polymer.

Figure 6:
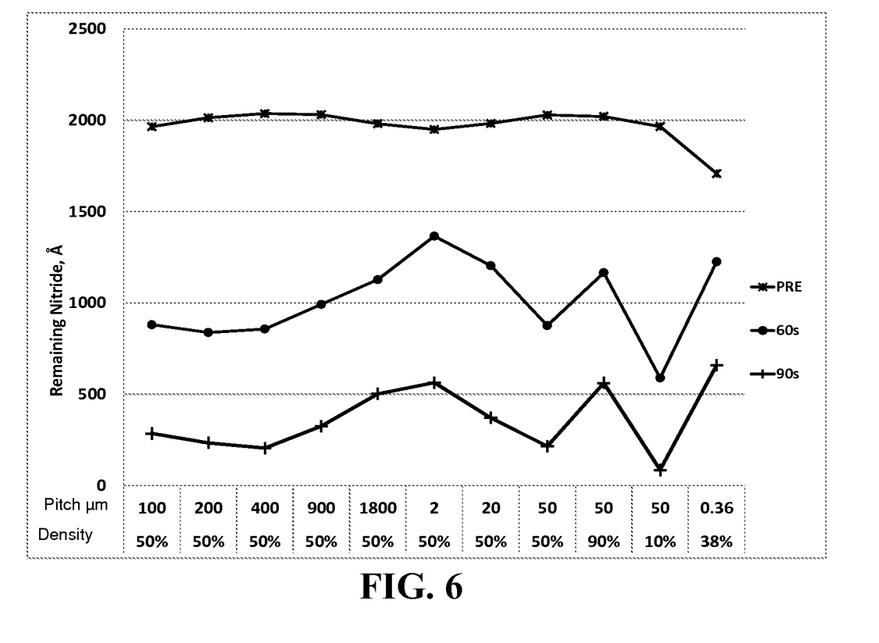
FIG. 6 provides a graph of remaining patterned silicon nitride observed upon polishing a patterned wafer with a CMP composition comprising a non-quaternized poly(vinylpyridine) polymer as described in comparative Example 5, at polishing times of 0 (PRE), 60, and 90 seconds; the layer thickness values (in Å) shown were determined for lines features with pitches of 2, 20, 100, 200, 400, 900 and 1800 μm at a line density of 50%, line features with pitches of 50 μm at line densities of 90%, 50%, and 10%, and a D-cell feature at a density of about 38%.
Figure 7:
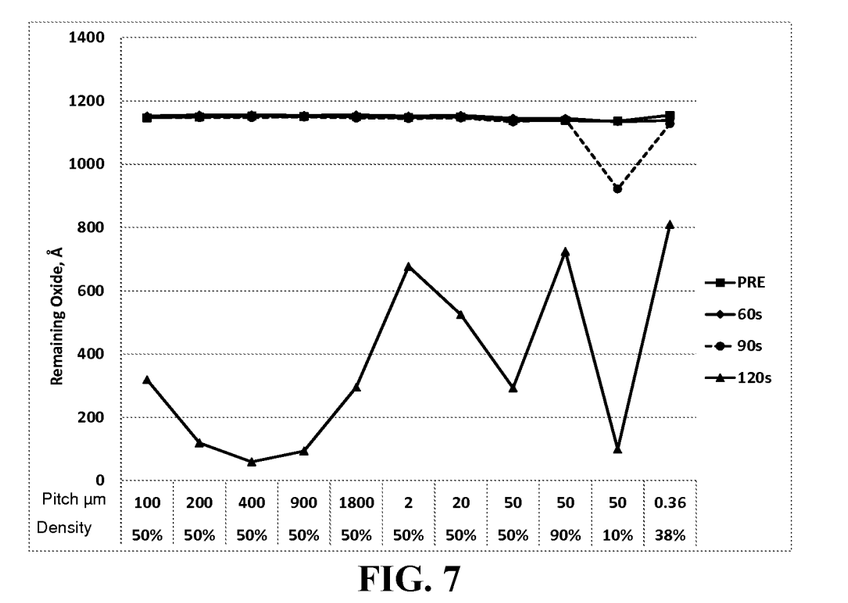
FIG. 7 provides a graph of remaining patterned silicon oxide observed upon polishing a patterned wafer with a CMP composition comprising a non-quaternized poly(vinylpyridine) polymer as described in comparative Example 5, at polishing times of 0 (PRE), 60, 90, and 120 seconds; the layer thickness values (in Å) shown were determined for lines features with pitches of 2, 20, 100, 200, 400, 900 and 1800 μm at a line density of 50%, line features with pitches of 50 μm at line densities of 90%, 50%, and 10%, and a D-cell feature at a density of about 38%.

An aqueous polishing slurry having a pH of about 4 and comprising colloidal ceria (0.4 wt %, primary mean particle size of about 60 nm) and about 160 ppm of poly(4-vinylpyridine), and about 1000 ppm of poly(ethylene glycol) (PEG 1450) in water was used to polish nitride and oxide blanket wafers and a patterned wafer comprising patterned silicon nitride and silicon oxide. Polishing was accomplished using a DOW IC1010 pad on a MIRRA polisher at a platen speed of 100 rpm, a carrier speed of about 85 rpm, a down force of about 2 psi, and a slurry flow rate of about 150 mL/minute. The results from polishing blanket wafers indicated a nitride/oxide selectivity of about 187 (936 Å/min nitride removal rate and 5 Å/min oxide removal rate). FIG. 6 and FIG. 7 provide graphs of remaining nitride and remaining oxide, respectively, at polishing times of 60, 90, and 120 seconds, along with the initial nitride and oxide thicknesses (labeled "PRE") for comparison. In contrast to the blanket wafer results, the polishing results on the patterned wafer indicated a nitride/oxide selectivity of about 0.5 (i.e., faster oxide removal than nitride removal), with an estimated nitride removal rate of about 1200 Å/min and an estimated oxide removal rate of about 2400 Å/min.

Example 6 (Comparative)

This example illustrates that CMP slurries comprising a quaternary amino cationic polymer that is not functionalized with quaternized nitrogen-heteroaryl groups fails to provide the desired selectivity for nitride removal.

Figure 8:
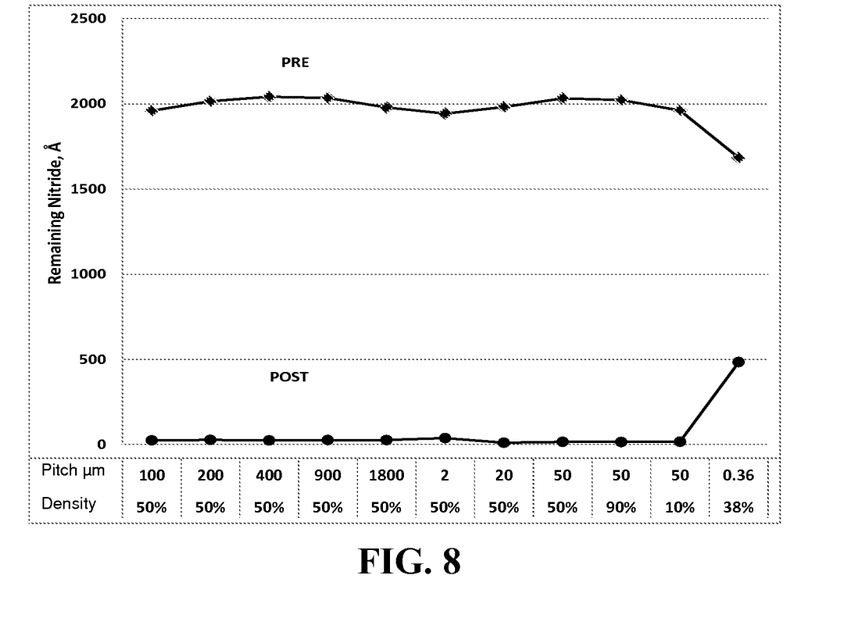
FIG. 8 provides a graph of remaining patterned silicon nitride observed upon polishing a patterned wafer with a CMP composition comprising polyMADQUAT cationic polymer as described in comparative Example 6, at an OP time of 10 seconds compared to the pre-polishing nitride thickness; the normal polishing end point was 155 seconds; the layer thickness values (in Å) shown were determined for lines features with pitches of 2, 20, 100, 200, 400, 900 and 1800 μm at a line density of 50%, line features with pitches of 50 μm at line densities of 90%, 50%, and 10%, and a D-cell feature at a density of about 38%.
Figure 9:
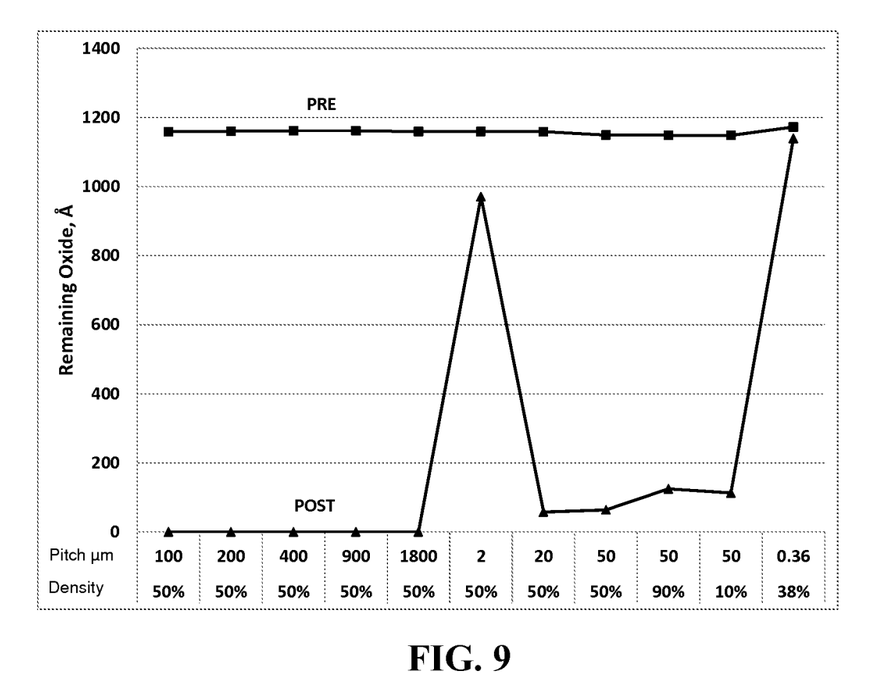
FIG. 9 provides a graph of patterned silicon oxide removal observed upon polishing a patterned wafer with a CMP composition comprising polyMADQUAT cationic polymer as described in comparative Example 6, at an OP time of 10 seconds compared to the pre-polishing oxide thickness; the normal polishing end point was 155 seconds; the layer thickness values (in Å) shown were determined for lines features with pitches of 2, 20, 100, 200, 400, 900 and 1800 μm at a line density of 50%, line features with pitches of 50 μm at line densities of 90%, 50%, and 10%, and a D-cell feature at a density of about 38%.

An aqueous polishing slurry having a pH of about 9 and comprising colloidal ceria (0.4 wt %, primary mean particle size of about 60 nm) and about 230 ppm of poly(2-methacryloyloxyethyltrimethylammonium chloride), also known as "polyMADQUAT" in water was used to polish nitride and oxide blanket wafers and a patterned wafer comprising patterned silicon nitride and silicon oxide. Polishing was accomplished using a DOW IC1010 pad on a MIRRA polisher at a platen speed of 100 rpm, a carrier speed of about 85 rpm, a down force of about 2 psi, and a slurry flow rate of about 150 mL/minute. A nitride/oxide selectivity of about 3.3 (924 Å/min nitride removal rate and 277 Å/min oxide removal rate) was observed for the blanket wafers. Polishing results for the patterned wafer are shown in FIG. 8 and FIG. 9, respectively, for nitride and oxide at an over polish of 10 seconds (normal end point of 155 seconds) compared to the respective initial thicknesses of nitride and oxide ("PRE"). The estimated nitride removal rate for the patterned wafer was about 800 Å/min and the estimated oxide removal rate was about 4000 Å/min, giving a nitride/oxide selectivity of about 0.2 (i.e., the slurry was selective for oxide removal). Thus, the results described herein indicate that only the quaternized nitrogen-heteroaryl cationic polymers provided the required selectivity for nitride removal relative to oxide removal, whereas a quaternized polymer with aliphatic quaternary amino groups does not provide such selectivity.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The terms "consisting of" and "consists of" are to be construed as closed terms, which limit any compositions or methods to the specified components or steps, respectively, that are listed in a given claim or portion of the specification. In addition, and because of its open nature, the term "comprising" broadly encompasses compositions and methods that "consist essentially of" or "consist of" specified components or steps, in addition to compositions and methods that include other components or steps beyond those listed in the given claim or portion of the specification. Recitation of ranges of values herein are merely intended to serve as a shorthand method of referring individually to each separate value falling within the range, unless otherwise indicated herein, and each separate value is incorporated into the specification as if it were individually recited herein. All numerical values obtained by measurement (e.g., weight, concentration, physical dimensions, removal rates, flow rates, and the like) are not to be construed as absolutely precise numbers, and should be considered to encompass values within the known limits of the measurement techniques commonly used in the art, regardless of whether or not the term "about" is explicitly stated. All methods described herein can be performed in any suitable order unless otherwise indicated herein or otherwise clearly contradicted by context. The use of any and all examples, or exemplary language (e.g., "such as") provided herein, is intended merely to better illuminate certain aspects of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

We claim:

1. A chemical mechanical polishing (CMP) method for selectively removing silicon nitride relative to silicon oxide from a substrate comprising silicon nitride and silicon oxide, the method comprising abrading a surface of the substrate with a CMP composition to remove at least some silicon nitride therefrom; the CMP composition comprising a particulate abrasive suspended in an aqueous carrier containing a cationic polymer bearing pendant quaternized nitrogen-heteroaryl moieties; wherein the composition has a pH of about 7.1 to about 9.5 and the cationic polymer is present at a concentration sufficient for at least a portion of the polymer to adsorb on the surface of the abrasive particles to maintain a zeta potential of at least +20 mV on the surface of the particles of the particulate abrasive at a basic pH.

2. The method of claim 1 wherein the particulate abrasive comprises colloidal ceria.

3. The method of claim 1 wherein the particulate abrasive has a mean particle size of about 10 to about 200 nm.

4. The method of claim 1 wherein the abrasive is present in the CMP composition at a concentration of about 0.1 to about 0.5 percent by weight (wt %), and the cationic polymer is present in the CMP composition at a concentration of about 20 to about 100 parts-per-million (ppm).

5. The method of claim 1 wherein the cationic polymer comprises a plurality of repeating units of formula —CH2CHR— in which R is a quaternized nitrogen heteroaryl moiety.

6. The method of claim 1 wherein the cationic polymer is selected from the group consisting of a quaternized poly (vinylpyridine), a quaternized poly(vinylimidazole) and a combination thereof.

7. The method of claim 1 wherein the cationic polymer comprises a poly(vinyl-N-methylpyridinium) homopolymer, a poly(N1-vinyl-N3-methylimidazolium) homopolymer, or a combination thereof.

8. The method of claim 1 wherein the cationic polymer includes one or more counter-ions selected from the group consisting of a halide, nitrate, and methylsulfate.

9. The method of claim 1 wherein the abrading is accomplished in conjunction with a polishing pad in a CMP polishing apparatus.

10. A chemical mechanical polishing (CMP) composition suitable for selectively removing silicon nitride relative to silicon oxide from a substrate comprising silicon nitride and silicon oxide; the composition containing a cationic polymer bearing pendant quaternized nitrogen-heteroaryl moieties; wherein the composition has a pH of about 7.1 to about 9.5 and the cationic polymer is present at a concentration sufficient for at least a portion of the polymer to adsorb on the surface of the abrasive particles to maintain a zeta potential of at least +20 mV on the surface of the particles of the particulate abrasive at a basic pH.

11. The CMP composition of claim 10 wherein the particulate abrasive comprises colloidal ceria.

12. The CMP composition of claim 10 wherein the particulate abrasive has a mean particle size of about 10 to about 200 nm.

13. The CMP composition of claim 10 wherein the particulate abrasive is present in the composition at a concentration of about 0.1 to about 2 wt %.

14. The CMP composition of claim 10 wherein the cationic polymer is present in the composition at a concentration of about 20 to about 500 ppm.

15. The CMP composition of claim 10 wherein the cationic polymer comprises a plurality of repeating units of formula —CH2CHR— in which R is a quaternized nitrogen heteroaryl moiety.

16. The CMP composition of claim 10 wherein the cationic polymer is selected from the group consisting of a quaternized poly(vinylpyridine), a quaternized poly(vinylimidazole) and a combination thereof.

17. The CMP composition of claim 10 wherein the cationic polymer comprises a poly(vinyl-N-methylpyridinium) homopolymer, a poly(N1-vinyl-N3-methylimidazolium) homopolymer, or a combination thereof.

18. The CMP composition of claim 10 wherein the cationic polymer includes one or more counter-ions selected from the group consisting of a halide, nitrate, and methylsulfate.

* * * * *